(12) United States Patent
Li

(10) Patent No.: US 10,869,386 B2
(45) Date of Patent: Dec. 15, 2020

(54) METHOD AND STRUCTURE FOR LAYOUT AND ROUTING OF PCB

(71) Applicant: ZHENGZHOU YUNHAI INFORMATION TECHNOLOGY CO., LTD., Henan (CN)

(72) Inventor: Deheng Li, Henan (CN)

(73) Assignee: ZHENGZHOU YUNHAI INFORMATION TECHNOLOGY CO., LTD., Henan (CN)

( * ) Notice: Subject to any disclaimer, the term of this patent is extended or adjusted under 35 U.S.C. 154(b) by 0 days.

(21) Appl. No.: 16/493,228

(22) PCT Filed: Jun. 13, 2018

(86) PCT No.: PCT/CN2018/090980
§ 371 (c)(1),
(2) Date: Sep. 11, 2019

(87) PCT Pub. No.: WO2019/062209
PCT Pub. Date: Apr. 4, 2019

(65) Prior Publication Data
US 2020/0137880 A1 Apr. 30, 2020

(30) Foreign Application Priority Data
Sep. 26, 2017 (CN) .......................... 2017 1 0881052

(51) Int. Cl.
*H05K 1/02* (2006.01)
(52) U.S. Cl.
CPC ......... *H05K 1/0218* (2013.01); *H05K 1/0298* (2013.01); *H05K 2201/09327* (2013.01)

(58) Field of Classification Search
CPC ............... H05K 1/0218; H05K 1/0298; H05K 2201/09327; H05K 2201/0723; H05K 2201/09309
See application file for complete search history.

(56) References Cited

U.S. PATENT DOCUMENTS

2005/0039947 A1 2/2005 Ohsaka
2005/0225955 A1* 10/2005 Grebenkemper .... H05K 1/0218
361/780
(Continued)

FOREIGN PATENT DOCUMENTS

CN 202425186 U 9/2012
CN 203399401 U 1/2014
(Continued)

OTHER PUBLICATIONS

CN203399401, Printed circuit board structure realizing electromagnetic interference reduction during signal penetration (Year: 2014).*
(Continued)

*Primary Examiner* — Steven T Sawyer
(74) *Attorney, Agent, or Firm* — Yue (Robert) Xu; Apex Attorneys at Law, LLP

(57) ABSTRACT

Disclosed are a method and a structure for layout and routing of a PCB. The method includes: arranging signal lines, a power plane and a ground plane of the PCB in combination, where a portion of a reference plane for the signal lines is configured as a ground plane for providing a reference plane and return paths for the signal lines, to save routing spates. Layout of regions for the power supply, the ground and signal lines is appropriately designed, thereby improving the design density of a board, reducing the number of layers of the PCB, and saving cost.

4 Claims, 4 Drawing Sheets

(56) References Cited

U.S. PATENT DOCUMENTS

| | | | | |
|---|---|---|---|---|
| 2008/0259555 A1* | 10/2008 | Bechtolsheim | ....... | G06F 13/409 361/679.4 |
| 2009/0045889 A1* | 2/2009 | Goergen | .............. | H05K 1/0216 333/175 |
| 2011/0088928 A1* | 4/2011 | Lim | ........................ | H05K 3/44 174/252 |

FOREIGN PATENT DOCUMENTS

| | | | |
|---|---|---|---|
| CN | 105657962 A | 6/2016 | |
| CN | 107592728 A | 1/2018 | |

OTHER PUBLICATIONS

International Search Report for PCT/CN2018/090980 dated Sep. 12, 2018, ISA/CN.
The 1st Office Action regarding Chinese Patent Application No. CN201710881052.8, dated Nov. 22, 2018. English Translation Provided by Google Translation.

* cited by examiner

| |
|---|
| L1: PCIE slots and DDR |
| L2: Ground plane |
| L3: DDR, High-speed lines and other lines |
| L4: Power plane and Ground plane |
| L5: QPI wiring and Power plane |
| L6: QPI wiring, Ground plane, High-speed lines and other lines |
| L7: Power plane and Ground plane |
| L8: DDR, High-speed lines and other lines |
| L9: Ground plane |
| L10: PCIE slots and DDR |

Figure 6

METHOD AND STRUCTURE FOR LAYOUT AND ROUTING OF PCB

The application is the national phase of International Application No. PCT/CN2018/090980, titled "METHOD AND STRUCTURE FOR LAYOUT AND ROUTING OF PCB", filed on Jun. 13, 2018, which claims the priority to Chinese patent application No. 201710881052.8 titled "METHOD AND STRUCTURE FOR LAYOUT AND ROUTING OF PCB", filed with the China National Intellectual Property Administration on Sep. 26, 2017, which are incorporated herein by reference in their entireties.

FIELD

The present disclosure relates to the technical field of layout and routing of signal lines and power supply lines of a PCB (printed circuit board), and in particular to a method and a structure for layout and routing of a PCB.

BACKGROUND

With the rapid development of the Internet and big data, and with the advent of the cloud computing era, cloud computing centers and big data centers have been rapidly developed and expanded, and the resulting requirement and usage of server and storage have increased. As the support for data processing and storage of the cloud computing and the big data, servers and storages directly determine the stability of the entire system.

As the core of the server, the design quality of the PCB directly determines the stability of the server. The PCB is mainly composed of signal lines and a power supply. In design, the design of the signal and the power supply should be comprehensively considered, and a high-quality PCB should be designed while minimizing the design cost.

A design solution of a conventional motherboard is a 12-layer board, where signal lines and power supplies on the stacked layers are designed from top to bottom as follows:

| Layer Number | Function | | Signal Line |
|---|---|---|---|
| L1 | TOP | 1 oz | PCIE DDR |
| L2 | GND | 1 oz | Ground |
| L3 | Signal | 1 oz | DDR, QPI, other lines |
| L4 | Signal | 1 oz | High-speed line, other lines |
| L5 | GND | 1 oz | Ground |
| L6 | Power | 2 oz | Power supply |
| L7 | Power | 2 oz | Power supply |
| L8 | GND | 1 oz | Ground |
| L9 | Signal | 1 oz | High-speed line, other lines |
| L10 | Signal | 1 oz | DDR, QPI, High-speed line |
| L11 | GND | 1 o | Ground |
| L12 | BOT | 1 oz | PCIE DDR |

PCIE, DDR and high-speed lines are arranged on the TOP layer and the BOT layer, a complete ground plane is arranged on each of the L2, L5, L8, L11 layers, the high-speed lines and other lines are arranged on the L3, L4, L9 and L10 layers, power planes are arranged on the L6 and L7 layers. The signal lines on each layer of the above design have adjacent ground reference, and two layers of complete power planes and four layers of ground planes are provided, which is an optimal design method without considering cost.

According to the conventional design solutions, there is sufficient layout and routing space for power supplies, ground and signal lines, and there is also available space. In the current situation which is sensitive to costs of servers, servers are over-designed, which is unfavorable to enhancement of the competitiveness of the product.

SUMMARY

A method for layout and routing of a PCB is provided, which includes:

arranging signal lines, a power plane and a ground plane of the PCB in combination, wherein a portion of a reference plane for the signal lines is configured as a ground plane for providing a reference plane and return paths for the signal lines, thereby saving routing spaces.

A structure for layout and routing of a PCB is provided, which includes: signal lines, a power plane and a ground plane, where a portion of a reference plane for signal lines is configured as a ground plane for providing a reference plane and return paths for the signal lines, thereby saving routing spaces.

BRIEF DESCRIPTION OF THE DRAWINGS

FIG. 6 is a schematic diagram showing a PCB including 10 stacked layers.

DETAILED DESCRIPTION

The present disclosure is described in detail in conjunction with the embodiments with reference to the drawings.

A method for layout and routing of a PCB includes the following steps 1) to 3).

Figure 1:
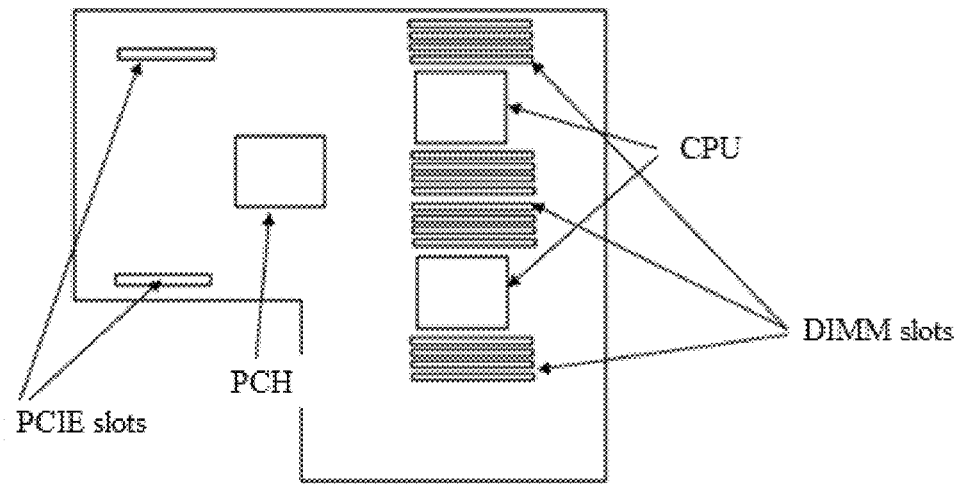
FIG. 1 is a schematic diagram showing a layout of a board.

In step 1), a shape of the PCB is determined and the main chips are arranged at appropriate positions on the PCB, including, as shown in FIG. 1, a region for arranging PCH (Platform Controller Hub) and PCIE (Peripheral Component Interconnect Express) slots, a region for arranging DIMM (dual-inline-memory-modules) slots and CPU (Central Processing Unit), and a region for QPI (Quick Path Interconnect) wiring, and the region for the QPI wiring is used for connecting two CPUs.

In step 2), a PCB including 10 stacked layers is provided, including L1 (TOP), L2, L3, L4, L5, L6, L7, L8 and L10 (BOT) from top to bottom, as shown in FIG. 6.

Figure 2:
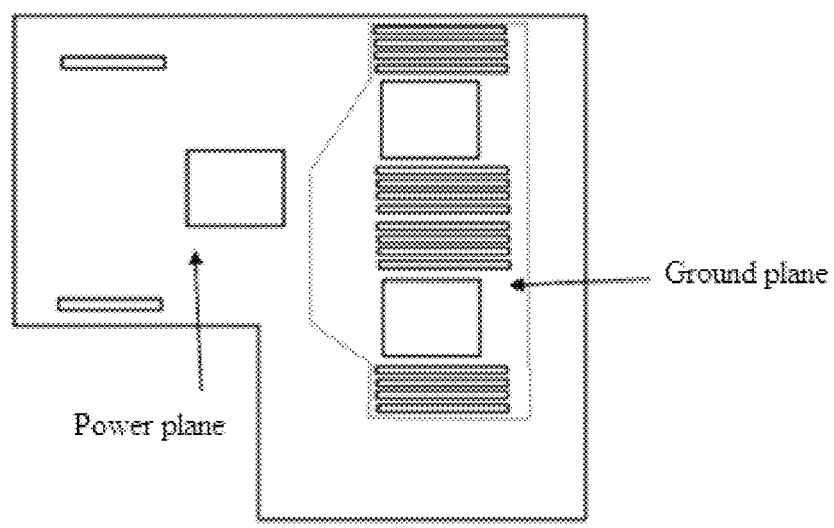
FIG. 2 is a schematic diagram showing a layout of an L4 layer.
Figure 3:
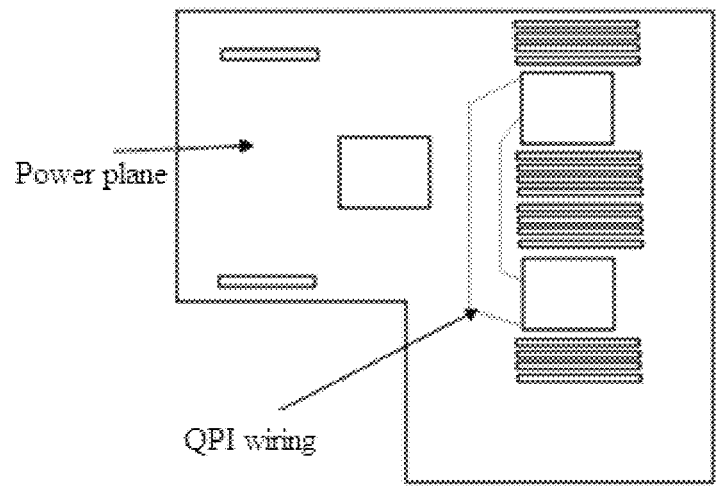
FIG. 3 is a schematic diagram showing a layout of an L5 layer.
Figure 4:
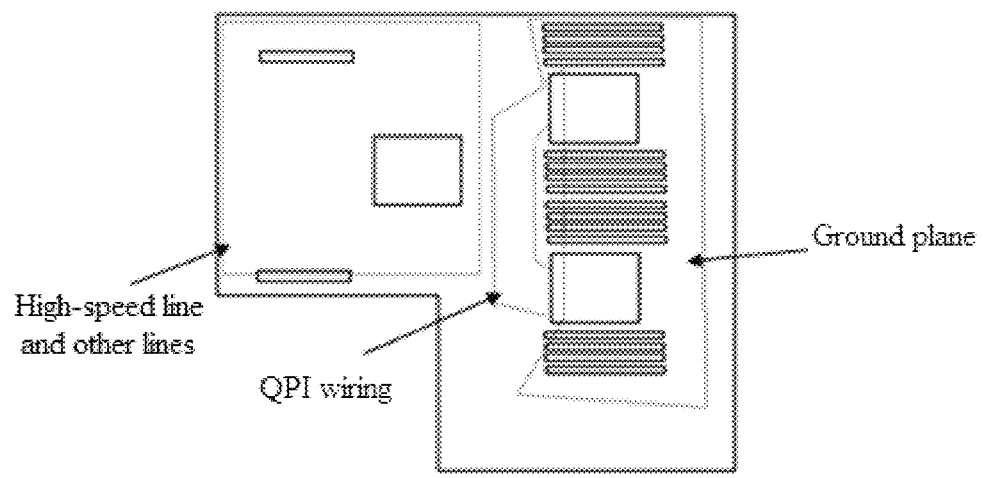
FIG. 4 is a schematic diagram showing a layout of an L6 layer.
Figure 5:
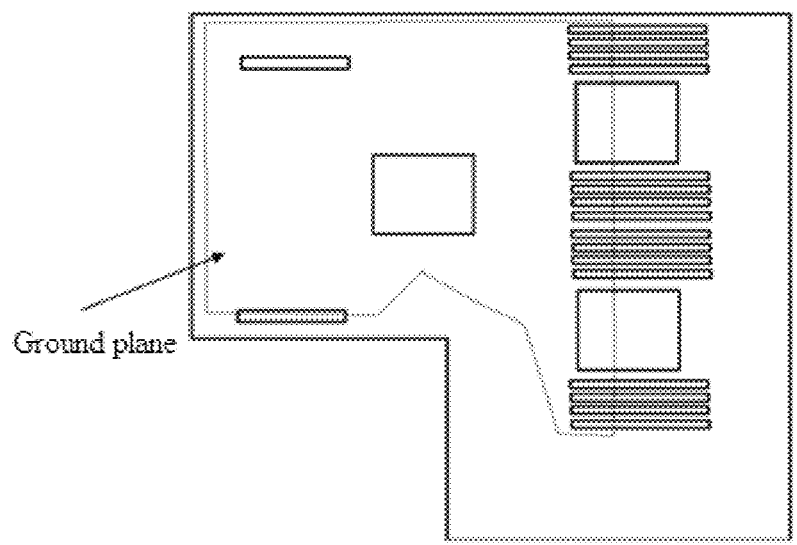
FIG. 5 is a schematic diagram showing a layout of an L7 layer.

In step 3), the L1 (TOP), L2, L3, L8, L9, L10 (BOT) layers are configured to have the conventional layout and routing, where:

the DDRs (double data rate) on the L3 layer and the DDR on the L8 layer are not changed, and the QPI signal lines are moved to the L5 layer and the L6 layer, the high-speed lines and other lines in the conventional 12-layer structure is moved to the L3 layer and the L8 layer of the 10 layers, a region of the L4 layer corresponding to the region for QPI wiring and the region for arranging DIMM slots and CPU is configured for a ground plane, and a remaining region of the L4 layer is configured for a power plane, as shown in FIG. 2, a region of the L5 layer corresponds to the region for QPI wiring is configured for arranging QPI signal lines, with the ground plane on the L4 layer being a reference plane corresponding to the QPI signal lines, and a remaining region of the L5 layer is configured for a power plane, as shown in FIG. 3, a region of the L6 layer corresponding to the region for QPI wiring is configured for arranging QPI signal lines, a region of the L6 layer corresponding to region for arranging PCH and PCIE slots is configured for arranging high-speed lines and other lines, and a region of the L6 layer corresponding to the region for arranging DIMM slots and CPU is configured for a ground plane, as shown in FIG. 4, and a region of the L7 layer corresponding to the region of the L6 layer configured for arranging QPI signal lines and the region of the L6 layer configured for arranging high-speed lines and other lines is configured for a ground plane, for providing reference for the QPI signal lines and the high-speed lines on the L6 layer, and a remaining region of the L7 layer is configured for power supply, as shown in FIG. 5

The layout is as follows.

| Layer Number | Function | | Signal Line |
|---|---|---|---|
| L1 | TOP | 1 oz | PCIE, DDR |
| L2 | GND | 1 oz | Ground |
| L3 | Signal | 1 oz | DDR, High-speed line, other lines |
| L4 | Power/GND | 2 oz | Power supply, Ground |
| L5 | Power/Signal | 1 oz | QPI, Power supply |
| L6 | Signal/GND/Power | 1 oz | QPI, Ground, High-speed line, other lines |
| L7 | Power/GND | 2 oz | Power supply, Ground |
| L8 | Signal | 1 oz | DDR, High-speed line, other lines |
| L9 | GND | 1 oz | Ground |
| L10 | BOT | 1 oz | PCIE, DD |

The embodiments are only used to illustrate the present disclosure and are not intended to limit the present disclosure. Those skilled in the technical art can make some variations and improvements without departing from the spirit and scope of the present disclosure. All the equivalent technical solutions are also within the scope of the present disclosure, and the scope of the present disclosure should be defined by the claims.

The invention claimed is:

1. A method for layout and routing of a PCB, comprising:
arranging signal lines, a power plane and a ground plane of the PCB in combination, wherein
a portion of a reference plane for the signal lines is configured as a ground plane for providing a reference plane and return paths for the signal lines, the layout of the PCB comprises: a region for arranging a platform controller hub (PCH) and peripheral component interconnect express (PCIE) slots, a region for arranging dual-inline-memory-module (DIMM) slots and CPU, and a region for quick path interconnect (QPI) wiring, and the method comprises:
providing a PCB comprises 10 stacked layers,
arranging PCIE slots and a double data rate synchronous dynamic random access memory (DDR) memory on an L1 layer,
arranging a ground plane on an L2 layer,
arranging a DDR memory, high-speed lines, and other lines on an L3 layer,
arranging a power plane and a ground plane on an L4 layer,
arranging QPI wiring and a power plane on an L5 layer,
arranging QPI wiring, a ground plane, high-speed lines, and other lines on an L6 layer,
arranging a power plane and a ground plane on an L7 layer,
arranging a DDR memory, high-speed lines, and other lines on an L8 layer,
arranging a ground plane on an L9 layer,
arranging PCIE slots and a DDR memory on an L10 layer,
configuring a region of the L4 layer corresponding to the region for QPI wiring and the region for arranging DIMM slots and CPU for the ground plane, and configuring a remaining region of the L4 layer for the power plane, and
configuring a region of the L5 layer corresponds to the region for QPI wiring for arranging QPI signal lines, with the ground plane on the L4 layer being a reference plane corresponding to the QPI signal lines, and configuring a remaining region of the L5 layer for the power plane.

2. The method for layout and routing of a PCB according to claim 1, comprising:
configuring a region of the L6 layer corresponding to the region for QPI wiring for arranging QPI signal lines, configuring a region of the L6 layer corresponding to the region for arranging a PCH and PCIE slots for arranging high-speed lines and other lines, and configuring a region of the L6 layer corresponding to the region for arranging DIM NI slots and CPU for a ground plane; and
configuring a region of the L7 layer corresponding to the region of the L6 layer configured for arranging QPI signal lines and the region of the L6 layer configured for arranging high-speed lines and other lines for a ground plane, for providing reference for the QPI signal lines and the high-speed lines on the L6 layer, and configuring a remaining region of the L7 layer for power supply.

3. A structure for layout and routing of a PCB, comprising:
signal lines, a power plane and a ground plane, wherein
a portion of a reference plane for signal lines is configured as a ground plane for providing a reference plane and return paths for the signal lines, the layout of the PCB comprises: a region for arranging a platform controller hub (PCH) and peripheral component interconnect express (PCIE) slots, a region for arranging dual-inline-memory-module (DIMM) slots and CPU, and a region for quick path interconnect (QPI) wiring, and,
the PCB comprising 10 stacked layers, wherein
PCIE slots and a double data rate synchronous dynamic random access memory (DDR) memory are arranged on an L1 layer,
a ground plane is arranged on an L2 layer,
a DDR memory, high-speed lines, and other lines are arranged on an L3 layer,
a power plane and a ground plane are arranged on an L4 layer,
QPI wiring and a power plane are arranged on an L5 layer,
QPI wiring, a ground plane, high-speed lines, and other lines are arranged on an L6 layer,
a power plane and a ground plane are arranged on an L7 layer,
a DDR memory, high-speed lines, and other lines are arranged on an L8 layer,
a ground plane is arranged on an L9 layer, PCIE slots and a DDR memory are arranged on an L10 layer, a region of the L4 layer corresponding to the region for QPI wiring and the region for arranging DIMM slots and CPU is configured for the ground plane, and a remaining region of the L4 layer is configured for the power plane, and a region of the L5 layer corresponds to the region for QPI wiring is configured for arranging QPI signal lines, with the ground plane on the L4 layer being a reference plane corresponding to the QPI signal lines, and a remaining region of the L5 layer is configured for the power plane.

4. The structure for layout and routing of a PCB according to claim 3, wherein a region of the L6 layer corresponding to the region for QPI wiring is configured for arranging QPI signal lines, a region of the L6 layer corresponding to the region for arranging a PCH and PCIE slots is configured for arranging high-speed lines and other lines, and a region of the L6 layer corresponding to the region for arranging DIMM slots and CPU is configured for a ground plane; and a region of the L7 layer corresponding to the region of the L6 layer configured for arranging QPI signal lines and the region of the L6 layer configured for arranging high-speed lines and other lines is configured for a ground plane, for providing reference for the QPI signal lines and the high-speed lines on the L6 layer, and a remaining region of the L7 layer is configured for power supply.

* * * * *